United States Patent [19]

Held

[11] Patent Number: 4,579,612

[45] Date of Patent: Apr. 1, 1986

[54] METHOD OF AND APPARATUS FOR THE CONTINUOUS PRODUCTION OF A COPPER-FACED ELECTROLAMINATE

[76] Inventor: Kurt Held, Alte Str. 1, D-7218 Trossingen 2, Fed. Rep. of Germany

[21] Appl. No.: 585,188

[22] Filed: Mar. 1, 1984

[30] Foreign Application Priority Data

Mar. 1, 1983 [DE] Fed. Rep. of Germany ....... 3307057

[51] Int. Cl.⁴ ............................................. B32B 31/08
[52] U.S. Cl. ....................................... 156/64; 29/335; 156/253; 156/281; 156/307.7; 156/322; 156/323; 156/324; 156/361; 156/389; 156/555; 156/583.1
[58] Field of Search ................. 29/335; 156/322, 324, 156/281, 389, 543, 555, 583.1, 323, 253, 64, 361, 307.7

[56] References Cited

U.S. PATENT DOCUMENTS

| | | |
|---|---|---|
| 2,728,703 | 12/1955 | Kiernan et al. |
| 4,510,008 | 4/1985 | Hoshi et al. ..................... 156/324 X |
| 4,521,265 | 6/1985 | Kunihiko et al. ................ 156/322 X |
| 4,541,889 | 9/1985 | Held ................................ 156/555 X |

FOREIGN PATENT DOCUMENTS

| | | |
|---|---|---|
| 1924110 | 5/1971 | Fed. Rep. of Germany . |
| 2059784 | 6/1971 | Fed. Rep. of Germany . |
| 2548556 | 5/1976 | Fed. Rep. of Germany . |
| 2722262 | 11/1978 | Fed. Rep. of Germany . |
| 2920722 | 12/1980 | Fed. Rep. of Germany . |
| 2941277 | 4/1981 | Fed. Rep. of Germany . |
| 83645 | 8/1971 | German Democratic Rep. . |

OTHER PUBLICATIONS

"Bau–und Möbelschreiner", 2/76, p. 52.
"Kunststoffe", vol. 62, 1972, No. 6, p. 356.

Primary Examiner—Robert A. Dawson
Attorney, Agent, or Firm—Toren, McGeady, Stanger, Goldberg & Kiel

[57] ABSTRACT

In the formation of an electrolaminate made up of a core of insulating material webs with a high purity electrolytic copper foil on at least one side of the core, for use as a circuit board in electronic equipment, the web of insulating material and the copper foil are led from supply rolls to a laminating machine in out-of-contact relation. Prior to its introduction into the laminating machine, the copper foil is heated to the temperature of the laminating operation so that it is at its maximum thermally expanded length when it contacts the insulating material webs. Further, dust is removed from the copper foil as it enters the laminating machine. The webs and copper foil are moved at the same speed through the laminating machine. After pressing the electrolaminate in the laminating machine, it is moved through a cooling device. Subsequently, the electrolaminate can be wound in a roll or cut into individual lengths.

20 Claims, 7 Drawing Figures

METHOD OF AND APPARATUS FOR THE CONTINUOUS PRODUCTION OF A COPPER-FACED ELECTROLAMINATE

SUMMARY OF THE INVENTION

The present invention is directed to a method of and apparatus for the continuous production of copper faced electrolaminates where insulating material webs forming the core of the electrolaminate and at least one copper foil are moved into contact at the entry into a laminating machine and are pressed into the electrolaminate during the passage through the machine.

With the introduction of transistor technology, the conventional support of structural elements and the conventional wiring has been abandoned at an increasing rate. By automatically forming the printed circuit board and using automatic soldering processes, the mass production of electronic equipment has been achieved and afforded a wider use of consumer electronics in the radio, television and sound recording industry. Accordingly, the electronic industry has an ever increasing need for high-quality copper-faced electrolaminates as the starting part for printed circuit boards. In view of this great need, a method for the inexpensive mass production of electrolaminates is desirable. In such electrolaminates, defects in the copper foil surface must be avoided to ensure reliable operation of the electronic devices in which such electrolaminates are used. Improvements in the quality of the formation of such electrolaminates are of great importance.

According to the DIN 40802 Sheet 2, copper-faced electrolaminates are formed of a laminated material faced on one or both sides with an electrolytic copper foil with a purity of at least 99.5%. The laminated core material acts as a supporting and insulating material, while the copper layer affords the required circuitry. In the formation of the core for electrolaminates, three products have gained importance, that is, paper, epoxy paper, or epoxy glass. In the telecommunications field where very high frequencies are involved, epoxy glass has been especially useful and has been used to an increasing degree despite its higher price as compared with paper. The advantages of such an electrolaminate are high mechanical strength, better electrical values under the action of moisture, and low dielectric loss at high frequencies.

Electrolaminates are formed in the following manner. The paper or fabric webs for the laminate core, for example, glass-fiber webs, are impregnated with a resin acting as a binder. Epoxy polyester, phenol or melamine are commonly used. When the impregnated webs are dried, the resin condenses to a desired degree. As a further step, an electrolytically precipitated copper foil is placed on a presssure sheet and the impregnated webs in the required number are placed on the copper foil in accordance with the desired laminate composition and thickness. If a copper coating is desired on both sides of the core or webs, the upper surface of the webs is covered with an additional electrolytically precipitated copper foil. Subsequently, the individual webs are bonded in a high pressure pressing operation under the action of heat to form the electrolaminate. In the pressing action, the copper foil bonds with the laminated core to form a compact member. To complete the operation, the edge of the laminate containing resin which has not been pressed is trimmed and the finished product is processed for use.

In this production operation, the critical step is the pressing operation. To assure effective use of a printed circuit board, it must be possible by maintaining clean surfaces during pressing, to avoid the development of any folds, perforations or pressing impressions in the surface of the copper foil which could cause circuit board interruptions. Pressing impressions are caused by small grains of dust attracted by electrostatic charges of the metallic surface formed by the copper foil. While such dust may not necessarily damage the circuit board or cause electrical interruptions in the copper foil, the dust may dent the foil surface. During further treatment of the electrolaminate in the formation of a circuit board, normally effected by printing and etching, the dents or pressing impresions may cause printing and etching imperfections. Due to the great difference in the coefficient of thermal expansion between the impregnated core and the copper foil of the electrolaminate, folds or separations may occur during the bonding of the copper foil to the laminate core if there is differential heating of the laminate components in the pressing or laminating apparatus. If the copper foil surface does not firmly adhere to the core of the electrolaminate a useless product results.

To press the individual layers of the electrolaminate together, an intermittently operating platen press has been used. As the webs forming the laminate core are drawn into the press, it is difficult to avoid the generation of dust and this dust settles on the copper foil by electrostatic attraction. This problem is quite serious when using glassfiber webs as the laminate core, since a fine glassfiber dust is generated. The contaminated copper surface has, as explained above, defects which result in imperfections in the circuit board whereby a part of the electrolaminate cannot be used. Due to the temperature rise in the press and the different coefficients of thermal expansion of the webs forming the core and the copper foil, the electrolaminate materials experience different elongations during the curing of the resin with imperfections occurring in the form of folds or detached layers. Further, due to the intermittent operation of the press, its manufacturing capacity cannot be fully utilized. With the ever-increasing demand for electrolaminates in the electronics industry, a continuous process for producing electrolaminates affords the optimum utilization of the laminating equipment and avoids scrap due to imperfections in the surface of the copper foil.

Therefore, it is the primary object of the present invention to improve the method and apparatus for producing electrolaminates so that the efficiency of the method and apparatus is increased while reducing the imperfections caused by dust, folds and detachments. Moreover, by continuously supplying the webs forming the core and the copper foil to the press, it is possible to avoid the handling of the sheets as in the past and also to reduce the manufacturing costs for the electrolaminates. In accordance with the present invention, the webs of the insulating material forming the core of the electrolaminate and the copper foil are supplied separately to the laminating apparatus with the copper foil being heated to the maximum temperature of the laminating apparatus before it contacts the webs so there is no problem with differential thermal expansion of the materials forming the electrolaminate. In addition, dust is removed from the copper foil as it enters into the laminating apparatus.

In accordance with the present invention, by utilizing a continuously operating laminating or pressing operation, the output of the electrolaminates is increased. By maintaining the temperatures of the copper foil and the webs forming the laminate core before the pressing operation and the curing of the resin in the core, an application of the copper foil on the core without any imperfections is possible. Any dust or other foreign bodies on the copper foil are removed by a scraper before the copper foil enters the pressing or laminating apparatus. As a result, defects in the electrolaminate subsequently used in forming a circuit board can be avoided to a great extent. The unpressed edge along the laminate, which is inevitable in platen presses, and must be trimmed as unusable, is avoided by the present invention, since the finished laminate core can be used for its full width and it can be cut in the lengthwise direction as needed. Accordingly, the quality and quantity of electrolaminates produced by the present invention are greatly increased over the processes used in the past.

The various features of novelty which characterize the invention are pointed out with particularity in the claims annexed to and forming a part of this disclosure. For a better understanding of the invention, its operating advantages and specific objects attained by its use, reference should be had to the accompanying drawings and descriptive matter in which there are illustrated and described preferred embodiments of the invention.

DETAILED DESCRIPTION OF THE INVENTION

Figure 1:
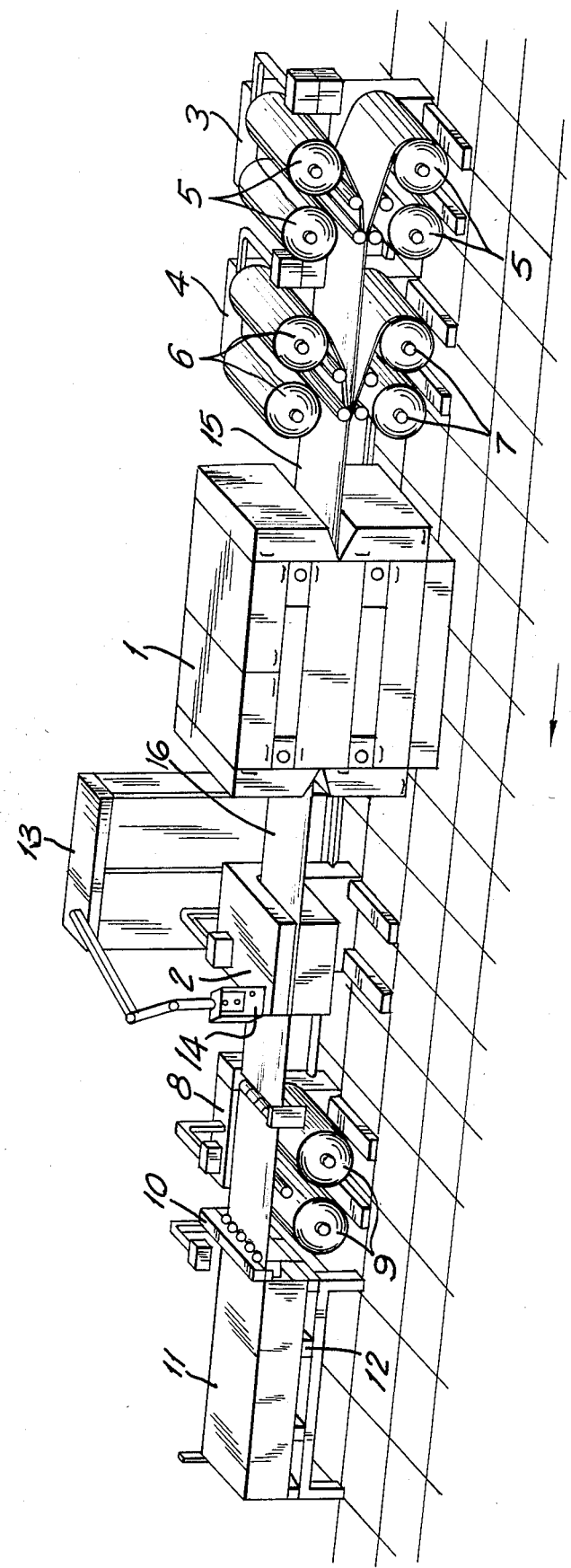
FIG. 1 is a perspective schematic showing of a production line for the continuous formation of electrolaminates.

The apparatus illustrated schematically in FIG. 1 includes a continuously operating laminating machine 1, a cooling and cleaning device 2 spaced downstream from the outlet from the laminating machine and operating with solvents, units 3 and 4 spaced upstream from the laminating machine for removing webs for forming the core of an electrolaminate and for removing copper foil from the rolls 6 and 7. A station 8 is located downstream from the cooling and cleaning device 2 and it contains rollers 9 for processing the electrolaminates with a shear 10 located on the downstream side of the station 8. In the region of the cooling and cleaning device 2, a control cabinet 13 is positioned with a data viewer 14. The finished product is a sheet material 11 loaded on a pallet 12.

Individual resin-impregnated webs, for instance, glassfiber or paper webs for forming the core of the electrolaminate, are removed from the rolls 8 and introduced into the continuously operating laminating machine with the number of webs determined according to the desired laminate composition. The laminating machine is a double belt press, such as known for the continuous production of decorative laminates. Electrolytically precipitated copper foil 15 is removed from the rolls 6 or 7 and is placed on one or both of the opposite faces of the laminate core formed by the webs removed from the rolls 5.

Figure 2:
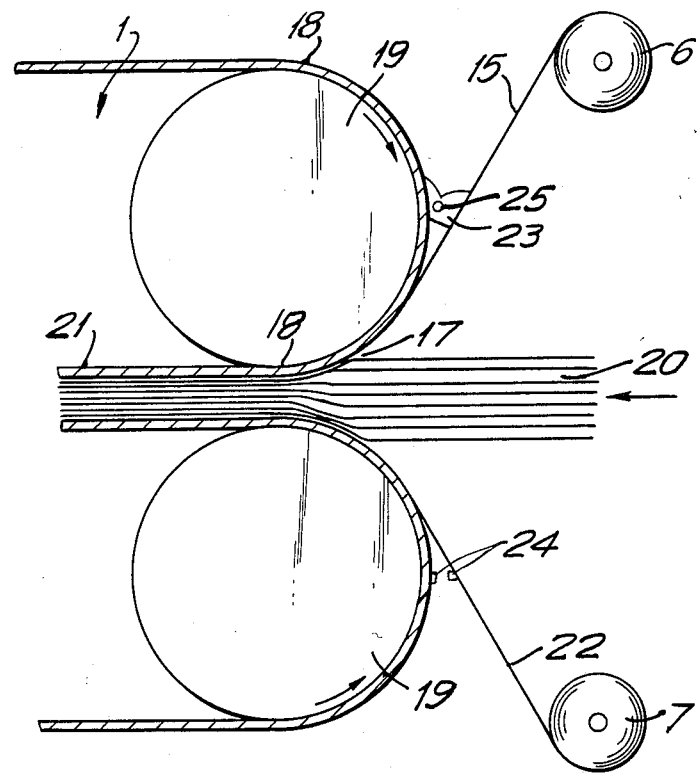
FIG. 2 is a schematic side view, enlarged as compared to FIG. 1, illustrating scrapers for removing dust and other foreign material from the copper foil before its entry into the laminating machine.

As illustrated in FIG. 2, the rolls 6 containing the copper foil 15 are located upstream from the laminating machine 1 so that the copper foil contacts the core 20 of the electrolaminate only after it enters the inlet 17 of the laminating machine, the inlet is formed between the two press belts 18 passing over the guide drums 19. Before the copper foil 15 enters the nip between the press belts 18, the copper foil 15 is guided over the press belt and before it contacts the core the temperature of the copper foil is raised to the temperature required for the curing of the resin impregnating the webs of the laminate core 20. The copper foil is preheated because of the high thermal conductivity of copper and the greatly different coefficients of thermal expansion of the copper and the webs forming the laminate core. By heating the copper foil to the desired temperature before it is introduced into contact with the webs forming the core 20, the copper foil reaches its maximum thermal elongation in the inlet 17 and when the copper foil is being bonded to the laminate core within the laminating machine 1 no further length variations occur, since such variations could tend to develop folds, cracks or separations between the foil and the core in that portion of the pressing region 21 when the resin has not fully hardened. To effect the preheating of the copper foil 15, the laminating machine can be arranged so that the guide drum 19 in the inlet 17 is heated. To assist the heating provided by the guide drum or as an alternative, an additional heat source for the copper foil can be arranged in front of or upstream of the inlet 17 so that the preheating can be effected without guiding the copper foil along the press belt 18 as it runs around the guide drum 19.

The electrolaminate can be faced with the copper foil on one side or both sides of the core. If only one side is being faced with the copper foil then only one supply roll 6 is used, however, if both sides are being faced then the two rolls 6 and 7 are used. Accordingly, in such an arrangement the lower guide drum 19 as shown in FIG. 2 would also be arranged to heat the copper foil running into the laminating machine from the supply roll 7. As an alternative, the copper foil could be heated by an additional heat source.

To make the temperature arrangement more effective, and to avoid any warping of the electrolaminate when it is cooled without the application of pressure, the double belt press may be divided into a heating zone and a cooling zone with the inlet and pressing zones being formed as heating zones so that the heating of the copper foil and the subsequent hardening of the laminate core and the bonding of the copper foil to the core can take place by both heat and pressure. The cooling of the electrolaminate occurs in the cooling zone located at the outlet from the double belt press.

In another embodiment of the invention the production of electrolaminates faced with copper on one side can be approximately doubled. In such an arrangement, the copper foil and the required number of core webs needed for the layer thickness of a first electrolaminate is provided over a separating foil and the required number of core webs are placed against the opposite side of the separating foil and faced with another copper foil. The separating foil can be a stainless steel or the like and is removed from a roll in front of or upstream of the laminating machine. By devices not illustrated and known per se, the stainless steel separating foil can be heated to an appropriate elevated temperature before it enters the pressing or laminating zone. Downstream from the laminating machine, the two electrolaminates are separated from the separating foil and can be wound into rolls or cut into sheets. Similarly, the separating foil is also wound onto a roll.

The dust generated as the individual webs enter into the double band press or laminating machine, settles by electrostatic attraction on metallic surfaces and, as a result, on the copper foil and on the press belts. The dust is removed by scrapers 23 or 24 as shown in FIG. 2. The scrapers contact the outer surface of the copper foil as it moves into contact with the surface of the guide drum 19. In other words, the dust is removed from the press belt and the copper foil at the point where the copper foil commences moving into contact with the core formed by the webs. The scraper can be formed of an elastic heat-resistant material, such as a plastics material, a plastics-felt or an elastomer, so that it rests tightly against one surface of the copper foil and also against the surface of the press belt 18 moving over the guide drum 19. As a result, the dust is removed from the copper foil and the press belt before it can cause any imperfections in the surface of the electrolaminate about to be pressed in the laminating machine.

In FIG. 2, two different arrangements of the scrapers 23, 24 are illustrated. Scraper 23 is formed with lips so that one lip bears against the surface of the copper foil and the other bears against the surface of the press belt. The dust removed from these surfaces collects in the center of the scraper in a channel 25 and can be blown axially out of the channel by a blast of clean air. This scraper arrangement is especially suitable for use with the above-mentioned preheating of the copper foil with the copper foil being introduced in contact with the surface of the press belt as it moves into the inlet of the laminating machine. In the region where the copper foil 15 approaches the press belt 18, shortly before the foil enters the inlet of the laminating machine, a wedge-shaped gap develops and the scraper can be positioned in this gap.

Another possible arrangement is shown by the scraper 24 in the form of a cord. The cord forms a endless member with one part in contact with the entire width of the press belt and the other part in contact with the entire width of the copper foil surface facing the press belt. The cord protrudes a little over both surfaces. The dust removed from these two surfaces is collected in the gap between the surfaces and the cord. As the endless cord is moved axially over the two surfaces, any dust or other foreign material is removed in the axial direction of the cord from the inlet into the laminating machine. As an alternative, the scraper may be formed of two separate scrapers, one bearing tightly against the copper foil surface and the other against the press belt surface in the vicinity of the inlet to the laminating machine. In such an arrangement, any dust or other foreign materials are collected before they enter into the laminating machine. Such an arrangement would be especially suitable when the copper foil is preheated by an additional heat source and is not supported by the press belt as it moves into the inlet of the laminating machine. With any impurities or foreign materials removed from the surface of the copper foil and the press belt at the inlet to the laminating machine, any imperfections in the electrolaminate are avoided.

Figure 3:
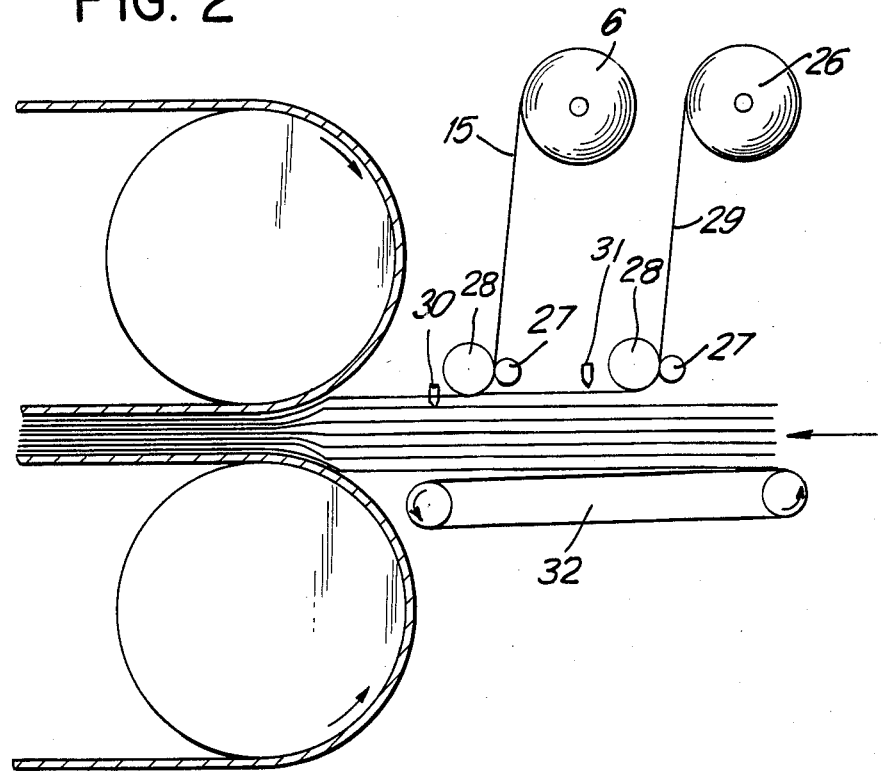
FIG. 3 is a schematic view illustrating apparatus for supplying the web material and copper foils into the laminating apparatus.

When a roll of the web forming the core or of the copper foil is used up, the continuous operation must be stopped, the empty roll replaced, and the web or foil threaded into the machine before production can be continued. To avoid such a stoppage, at least one additional supply roll 26 for each required roll 6 is arranged in front of or upstream of the laminating machine, as shown in FIG. 3. Each of the rolls 6, 26 is provided with a motor-operated drive roller 27 which provides unwinding of the material on the roll and breaking of the individual webs or foils. Further, guide rollers 28 are provided for the web or foil material. Shortly before a foil 15 is finally unwound from the supply roll 6, the web 29 on the other supply roll 26 is started to be removed and it is cut off perpendicularly with a shear 31. Similarly, the foil 15 is cut off perpendicularly with a shear 30 and the further removal of the foil from the roll 6 is stopped. Based on the spacing of the two shears and the rate of feed of the foils to be pressed in the laminating machine, it is easy to calculate the time for the individual webs so that the production of the electrolaminate is interrupted for only a few millimeters between the two rolls. To facilitate the introduction of the leading end of the new roll into the laminating machine, a conveyor belt 32 is provided moving below the rolls and it is driven at the same rate of speed as the webs forming the core of the laminate and extends into the inlet of the laminating machine.

Figure 4:
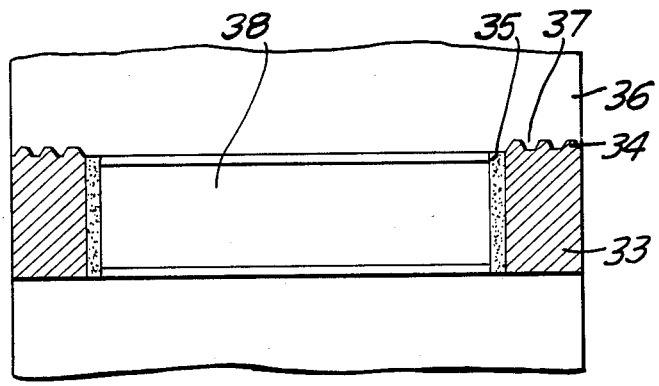
FIG. 4 is a schematic illustration of an edge support for the laminate in the laminating apparatus.

The required thickness tolerance, as set forth in DIN 40605 and DIN 40606, is obtained as shown in FIG. 4. Running along in the laminating machine is a pair of laterally spaced edge strips 3. These edge strips serve as edge support to ensure the required layer thickness of the laminate 38. The press belt 36 moving over the laminate has a profile 37 formed in its edge which is complementary to the countersurface 34 of the edge strip. Accordingly, the edge strip 33 is guided by the press band. Between the edge strip 33 and the laminate 38 being formed, a space 35 about 1.6 mm wide is formed and serves to receive any excess resin which flows out from between the webs forming the laminate core during the pressing operation. Accordingly, no unpressurized hardened edge is formed which would have to be cut off or removed after the electrolaminate exits from the laminating machine. As a result, the electrolaminate can be used in its full width.

Referring to FIG. 1, after the electrolaminate 16 exits from the outlet or downstream end of the laminating machine 1, it is still in a continuous form and it is divided by a shear 10 into sheet goods 11 stacked on pallets 12 for easy transport. The sheets can be cut in commercial sizes for use in the industry. Alternatively, if desired, the thin electrolaminate 16 can be wound on roll 9 in the winding station located upstream from the shear 10. Before the continuous electrolaminate 16 is cut into individual pieces, after its exit from the double belt press forming the laminating machine 1, it is passed through a cooling station 2 containing a solvent bath.

As a result, the cooling agent acts also as a cleaning agent for cleaning and degreasing the copper surface, so that, further treatment of the electrolaminate, that is, by printing with etch resist areas and etching the circuit lands or conductors, is effected immediately.

The rate at which the core webs pressed in the laminating machine are delivered depends on the thickness of the laminate and on the temperature of the press belts. For optimum conditions, the rate of feed is regulated by a velocity-temperature computer based on the above parameters. The velocity-temperature computer is located in the control cabinet 13. In addition, other functions of the production line can be controlled out of the control cabinet. The data viewer 14 is used for entering the process parameters required for the control.

The production line can be used to particular advantage for the production of multi-layer boards. In multi-layer boards, several single circuit boards are glued together as a packet. Such an arrangement affords greater flexibility in the layout of the circuit lands or conductors, since they can be arranged in several planes without crossing. With such an arrangement, however, there is the problem that an exact matching or alignment of the etch resist areas must be possible. Furthermore, any subsequent working operations performed on the boards, such as cutting, drilling, stamping, milling and the like must also be performed in an exact manner to assure the desired contact and connection between the individual circuit boards.

Figure 6:
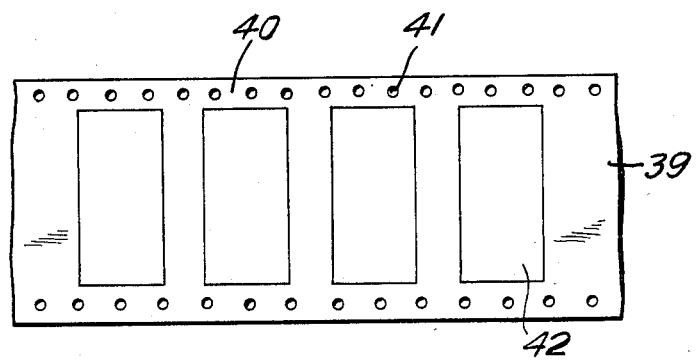
FIG. 6 is a plan view of the electrolaminate with holes formed along its edges.

The adjustment for exact matching of the working operations on the individual circuit boards is effected by providing perforated edges 40, note FIG. 6, extending along both edges of the electrolaminate 39. The perforated edges 40 include the holes 41 which are centered at a constant distance from one another. With reference to the holes 41, the etch resist areas 42 for the etching of the circuit conductors or lands can then be established. Subsequently matching or aligning of the individual circuit boards can also be affected by means of the holes 41. The perforated edges are formed in a punching operation after the continuous electrolaminate web passes through both the laminating machine 1 and the cooling device 2. The punching operation is controlled by the computer with the frequency of the punching operation depending on the rate of feed of the electrolaminate web through the laminating machine 1. As a result, the spacing of the holes 41 remain constant or uniform under all operating conditions of the production line and such spacing is indispensable for the precise production of the multi-layer boards.

For further treatment of the electrolaminate web two procedures are available. In one procedure, the continuous electrolaminate web is cut into single layer boards by using the fixing holes, and then the individual boards can be worked on separately by etching, drilling, stamping, milling and the like with the holes serving as reference points in each working operation. In another procedure, the continuous electrolaminate web is not cut into separate circuit boards, instead the individual patterns for each layer are printed on the laminate in reference to the perforated edges and the circuits are subsequently etched. As a result, a continuous laminate is obtained where the circuit patterns are spaced apart at predetermined distances always at the same spacing. For additional layers the continuous laminate is produced and the formation of the circuit arrangement is repeated again in the same spacing arrangement. Subsequently, the individual laminate sections can be processed immediately or can be wound up into rolls for later processing.

To press the individual lengths of the laminate into a multiple layer laminate, the individual laminate lengths can be superimposed on one another in the desired arrangement centered with reference to the holes formed in the edges of the laminates with an adhesive layer between them. Subsequently the stacked lengths of the laminate can be secured into a unit by exposure to pressure and heat. In such an arrangement, the production line is slightly modified as compared to the line shown in FIG. 1.

Figure 5:
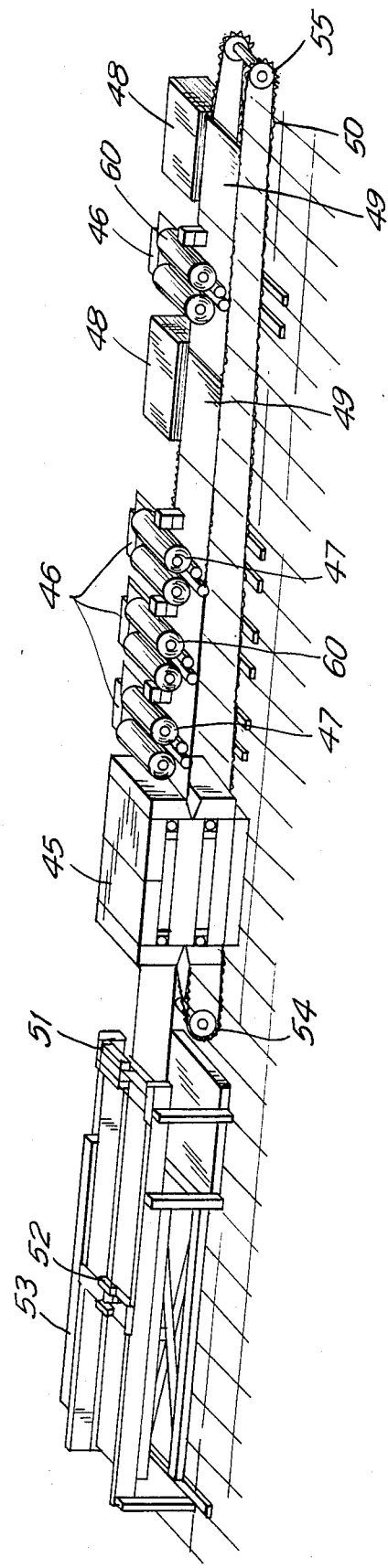
FIG. 5 is another perspective schematic view illustrating the continuous production of multi-layered laminated boards.

This second production line is shown schematically in FIG. 5 and includes a continuously operating laminating machine 45 with separate units 46 for supplying the individual laminate lengths 47 and adhesive layer webs 60 from a stacking unit 48 of the individual lengths 49 via a pin bushing chain device 50 into the laminating machine. After the individual layers, lengths or boards 49 are pressed together into a unit the circuit board panel thus formed is introduced into a cutting or stamping machine 51 downstream of the laminating machine followed by a receiving device for processing the multi-layer boards or panels 53.

The single layer laminates 47, containing the etched circuitry, are located by means of the holes formed in the edges. The individual laminate sections run from the units 46 via a roller bed or a conveyor belt into the continuously operating laminating machine 45 which includes a double press belt. The number of units 46 is based on the number of adhesive courses required in the multi-layer circuit board being assembled. The sequence in the arrangement of the units 46 correspond to the composition of the multi-layer boards. Between each of the laminate sections, an adhesive web 60 is positioned which is impregnated with a precondensed duroplastic resin and is removed from the units 46. The exact centering or locating of the individual layers relative to one another is afforded by means of the pin bushing chain 50, whose pins or teeth have the same spacing as the holes in the laminate sections. The chain 50 runs at the same speed as the multi-layer laminate sections along both of the opposite edges of the sections from a location below the units 46 into the laminating machine and, downstream from the laminating machine the chain is passed over a guide roller 54 and is returned to a location upstream from the laminating machine where it passes over another guide roller 55 for return in the downstream direction for movement back into the laminating machine. The placement of the leading ends of the individual laminate sections onto the pin bushing chain is effected with the aid of the centering holes so that the leading ends of all of the laminate sections in the multi-layer board are aligned one above the other as they enter into the laminating machine. With the aid of the pin bushing chain, which can be produced with a precision of 1/100 mm, and with the use of the exact matching holes in the edges of the laminate sections, the individual layers forming the multi-layer board are automatically centered, since due to the formation of the holes in the edges the fixed position of the laminate sections can be established.

Figure 7:
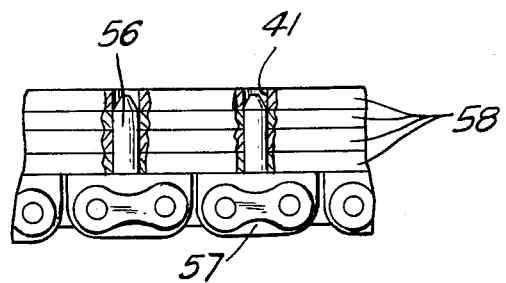
FIG. 7 is a side view of a pin or bushing chain used in the laminating apparatus.

If the individual layers are supplied in individual plate-like sections, they are stacked in the required sequence by the stacking unit 48. The assembly operation is as follows: the first plate-like section 49 is placed on the pin bushing chain 50 and moved toward the laminating machine. An adhesive layer web 60 is removed from the roll 46. As the first board moves downstream with the adhesive layer web in place, it passes the next stacking unit 48 and the next layer is placed on the first layer aligned by means of the pin bushing chain. By the engagement of the pins 56 formed in the chain 57, into the individual holes 41, note FIG. 7, the individual layers are automatically centered relative to one another, since the holes 41 can be punched very precisely and the chain 57 can be manufactured to very close tolerances. As the individual stacked laminate sections or plates are moved toward the laminating machine, additional adhesive layers and sections can be placed and aligned by means of the pin bushing chain 57.

As the assembled layers of the multi-layer board enter into the laminating machine, they are already centered and are bonded together by the application of the combination of heat pressure. As the pin bushing chain moves along the opposite edges of the assembled multi-layer boards, they cannot shift in the press even under the effect of pressure and friction and, therefore, remain centered until the resin is hardened.

After leaving the laminating machine, the pin bushing chain is lifted off the multi-layer board by the guide roller 54 and then returned back to the beginning of the operation where it moves over the upstream roller 55. In the cutting or stamping station 51, if the multi-layer boards are still in a continuous form rather than in the form of individual plates, they can be stamped or cut out into individual plates or boards. If single layer sections are used, the perforated edge is no longer necessary and can be trimmed in the station 51. Subsequently, the multi-layer boards are placed in stacks 53 in the receiving station 52 which includes a vacuum transport device. With the boards arranged in stacks they can be transported away from the production line for further processing.

While specific embodiments of the invention have been shown and described in detail to illustrate the application of the inventive principles, it will be understood that the invention may be embodied otherwise without departing from such principles.

I claim:

1. Method of continuously producing electrolaminates formed of a support core of insulating material webs with copper, in the form of high purity electrolytic copper foil, deposited on at least one of the sides of the support core, comprising the steps of removing resin-treated webs of the insulating laminate material for forming the core, moving the webs one superimposed on the other to a pressing station, removing the at least one copper foil from a supply roller and moving it toward the pressing station in out-of-contact relation with the webs, heating the copper foil to the temperature in the pressing station for achieving the maximum length thermal expansion of the copper foil before placing it in contact with the core formed by the webs, moving the webs and copper foil at equal speed, removing dust from the copper foil before it contacts the webs, moving the copper foil into contact with the webs and pressing the copper foil and webs together in the pressing station, removing the laminated copper foil and insulating core from the pressing station, and arranging the laminated copper foil and insulating core for subsequent use.

2. Method, as set forth in claim 1, wherein placing a separating stainless steel metal foil between an upper laminate core and a lower laminate core for movement through the pressing station, placing the copper foil in contact with the upper surface of the upper core and another copper foil in contact with the lower surface of the lower core and moving the assembly of the upper and lower cores and copper foils and the separating metal foil through the pressing station and after the exit of the assembly from the pressing station separating the upper core and copper foil and the lower core and copper foil from the separating foil.

3. Method, as set forth in claim 1 or 2, including the step of forming holes at uniform spacings along both edges of the copper foil and the webs forming the insulating core for use in processing the electrolaminate formed in the pressing station.

4. Method, as set forth in claim 1 or 2, including the step of controlling the speed of the individual webs forming the insulated core and the copper foil by a velocity-temperature computer based on the dwell times in the pressing station determined for the given temperature used in the pressing operation.

5. Method, as set forth in claim 1, including the step of heating the copper foil at the location where it enters the pressing station and before it is placed into contact with the webs forming the insulated core.

6. Method, as set forth in claim 5, including the step of removing dust from the copper foil at the same location where the copper foil is heated as it enters into the pressing station.

7. Method, as set forth in claim 1, including moving the individual electrolaminates formed in the pressing station toward a second pressing station and assembling the individual laminates in a superposed arrangement and passing the superposed arrangement through the second pressing station for forming a multi-layered electrolaminate, and processing the multi-layered electrolaminate downstream from the second pressing station for subsequent use.

8. Apparatus for continuously producing electrolaminates formed of a core of insulating resin-impregnated material webs with copper, in the form of high purity electrolytic copper foil, deposited on at least one of the opposite faces of the core, comprising a continuously operable laminating machine having an inlet end and an outlet end, a cooling device spaced downstream from the outlet end of said laminating machine, means for removing the webs from supply rolls, means for removing the copper foil from at least one supply roll, means for preheating the copper foil to the temperature required for curing the resin impregnating the webs of the core before the copper foil is introduced into contact with the webs, means for processing the laminate exiting from the laminating machine at a location downstream from the cooling device, and a control computer for maintaining the speed and temperature of the material web and the copper foil being formed into a laminate as it is passed through said laminating machine.

9. Apparatus, as set forth in claim 8, including an additional supply roll for each supply roll of the webs forming the core and the copper foil, means for removing the webs and the copper foil from said additional supply rolls, means for driving and braking the movement of the webs and foil from the additional supply rolls, a shear arranged for each said additional supply roll for cutting the beginning and end of each of the webs and foil, and conveyor means located below the webs and the copper foil and running at the same speed as the webs and the copper foil for supporting the webs and the copper foil into the inlet into said laminating machine, whereby said conveyor means serves for threading the beginnings of the webs and foils into the laminating machine from the additional supply rolls when the webs and foils from the supply rolls are exhausted.

10. Apparatus, as set forth in claim 8, wherein said laminating machine include a double press band assembly comprising a pair of opposite press bands each including a guide drum adjacent the inlet end of said laminating machine and another guide drum at the outlet end of said laminating machine, and arranging said supply rolls upstream from the inlet to said laminating machine so that the copper foil moves first in contact with the guide drum at the inlet before moving into contact with the webs entering the inlet and said means for preheating the copper foil comprising that said guide drum being heated for heating the copper foil to the desired temperature before the copper foil contacts the webs so that it has reached its maximum thermal elongation before contacting the webs.

11. Apparatus, as set forth in claim 10, including a heat source for said guide drum for heating the copper foil.

12. Apparatus, as set forth in claim 8, wherein said means for preheating the copper foil comprises a heat source located in the path of the copper foil approaching the inlet to said laminating machine for preheating the copper foil to the temperature within the laminating machine.

13. Apparatus, as set forth in claim 8, wherein said laminating machine is divided into a heating zone extending from the inlet thereof toward the outlet and a cooling zone extending from the downstream end of the heating zone to the outlet from said laminating machine so that the copper foil and webs forming the insulated core can be heated to the required process temperature and subsequently cooled while the copper foil and core is under pressure within said laminating machine.

14. Apparatus, as set forth in claim 8, including a scraper positioned in the path of the copper foil approaching the inlet of said laminating machine for contacting the copper foil and removing dust and foreign materials therefrom.

15. Apparatus, as set forth in claim 14, wherein said scraper comprises a lip member formed of a heat resistant elastic material and containing a through-channel, said lip arranged to press tightly against the surface of the copper foil for removing dust and foreign materials, and means for supplying clean air to said channel for the removal of the dust and foreign materials.

16. Apparatus, as set forth in claim 8, wherein said scraper is an endless cord type member with said cord type member running across the surface of the copper foil transversely of the direction into the inlet in said laminating machine, as said cord type member moves in contact with the surface of the copper foil dust and foreign material are removed from the inlet to the laminating machine.

17. Apparatus, as set forth in claim 10, comprising a first scraper and a second scraper each arranged at the inlet to said laminating machine, said first scraper arranged to bear against the surface of the copper foil moving into the inlet to said laminating machine and the second scraper arranged to press against the surface of the press belt moving over the guide drum at the inlet to said laminating machine.

18. Apparatus, as set forth in claim 10, wherein said laminating machine is provided with a profiled edge strip along each side extending in the direction of movement of the core and copper foil through the laminating machine, a profiled edge strip formed along each of said edges, the opposite edges of the press belt having a complementary profile in the edges thereof for engaging the profiled edge strip so that the thickness tolerance of the electrolaminate being formed is ensured along the edges of the laminating machine.

19. Apparatus, as set forth in claim 8, including means for forming holes along each edge of the electrolaminate after it has passed out of the laminating machine.

20. Apparatus, as set forth in claim 8, including a second laminating machine, means for moving an electrolaminate into the second laminating machine in a stacked arrangement and for introducing adhesive web layers between adjacent electrolaminates, means for centering the individual electrolaminates relative to one another with a precision of at least 1/100 mm, said means comprising a pin bushing chain with pins extending outwardly from the chain so that said pins can interengage holes formed in the edges of the electrolaminates for introducing the electrolaminates into, through and out of said laminating machine and bonding the stacked electrolaminates into a multi-layer member.

* * * * *